March 29, 1966 G. R. BRAINERD ET AL 3,243,728

SINE WAVE GENERATOR COMPRISING A PLURALITY OF RESONANT CIRCUITS DISCHARGED INTO A RESONANT LOAD

Filed June 28, 1963 2 Sheets-Sheet 1

WITNESSES:

Bernard R. Gieguay

James F. Young

INVENTORS

Gideon R. Brainerd, Wayne R. Olson, and Edward H. Hooper.

BY William L. Gates

ATTORNEY

United States Patent Office 3,243,728

Patented Mar. 29, 1966

3,243,728

SINE WAVE GENERATOR COMPRISING A PLURALITY OF RESONANT CIRCUITS DISCHARGED INTO A RESONANT LOAD

Gideon R. Brainerd, Severna Park, Wayne R. Olson, Catonsville, and Edward H. Hooper, Baltimore, Md., assignors to Westinghouse Electric Corporation, East Pittsburgh, Pa., a corporation of Pennsylvania Filed June 28, 1963, Ser. No. 291,571
3 Claims. (Cl. 331—117)

This invention relates generally to means for generating high power alternating current, and more particularly to a multisection sine wave generator capable of generating relatively high radio frequency (RF) power with electronic devices operating in a binary switching mode.

Present electronic methods of generating high alternating current (A.C.) power for radio transmitters and the like, usually use class A, class B or class C amplifiers which are known to be limited in efficiency. Also the power output is limited by the dissipation of the active device or devices used for control. Thus, there is a need for a means for generating high RF power with a corresponding high efficiency and extremely good reliability. In other words, there exists a requirement for a system which can generate high power with a corresponding high overall operating efficiency with devices which, themselves, have a limited power handling capacity.

It is an object of the present invention, therefore, to provide a means for generating high alternating current power with improved efficiency utilizing electrically controlled switches.

It is another object of the present invention to generate a large amount of alternating current power with electronic devices which do not necessarily have high power dissipation characteristics.

It is still another object of the present invention to provide a high efficiency RF power generator capable of producing a relatively large amount of alternating current power for a radio frequency transmitter.

It is yet another object of the present invention to provide a high efficiency RF power source for a solid state radio frequency transmitter.

And still another object of the present invention is to provide a high efficiency RF power generator for a solid state transmitter operating at very low frequencies (VLF), providing high output power with semiconductor devices utilized as the active elements.

Briefly, the present invention accomplishes the above-cited objects by charging a plurality of identical energy storage units or sections to a predetermined level from a D.C. power source and then discharging each of the energy storing units in a predetermined order into a resonant load, such as a tank circuit. More particularly, a plurality of electrical energy storage units are used in combination with electrically controllable switches, such as controlled rectifiers, to alternately charge each unit to a predetermined voltage from a D.C. power source and then discharge the units into a resonant load, for example, one after another in "Gatling gun" fashion whereby each unit delivers its energy to the load causing it to oscillate and provide a high powered sine wave output of a predetermined frequency. Moreover, each of the switches in the plurality of energy storage units is controlled by a common driver source which provides properly coördinated and timed signals to each of the switches such that the charging and discharging of each unit is properly interlaced with the other units.

Other advantages and objects of the present invention will become apparent as the following description proceeds with reference to the accompanying figures in which.

Figure 1:
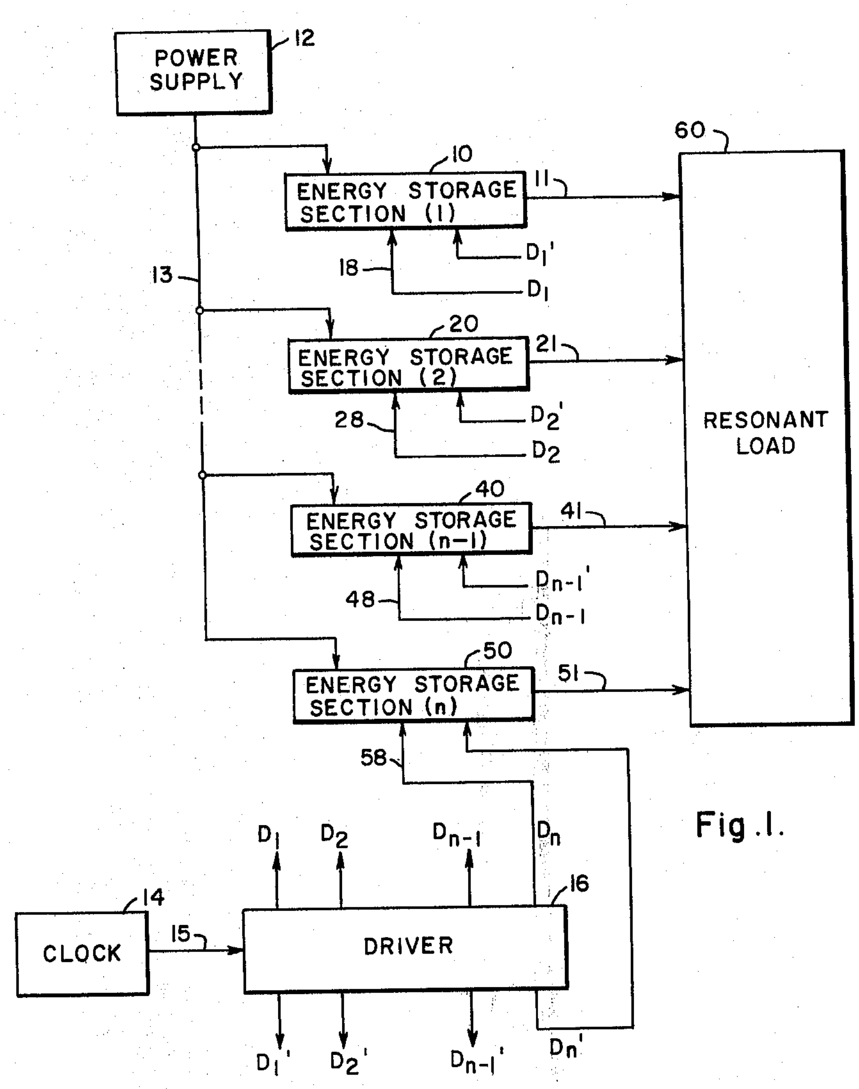
FIGURE 1 is a block diagram illustrating the subject invention.

Attention is now directed to FIGURE 1, which illustrates the invention in block diagrammatic form. Shown therein is a power supply 12 connected to a plurality of identical electrical energy storage sections or units (any number from 1 to $n$) shown as sections 1, 2, and $n-1$, and $n$ which are designated 10, 20, 40 and 50, respectively. These sections include electrical energy storage elements and electrically controllable switches for charging and discharging as will be explained subsequently in greater detail. Each of the units or sections 10–50 is connected to a resonant load 60 by means of individual electrical connections 11, 21, 41 and 51. A clock or timing means 14 is connected to a driver 16 through suitable circuit means 15. The driver is connected to each of the sections 10–50 by means of individual circuit means 18–58, respectively. The driver supplies charging and discharging trigger signals to each of the sections 10–50 such that control signal $D_1$ is fed to section 10, $D_2$ is fed to section 20, $D_{n-1}$ is connected to section 40 and trigger signal $D_n$ is fed to section 50. It should be pointed out that these controls $D_1$–$D_n$ may be one or more signals to preperly operate each section and will be explained in greater detail subsequently.

The basic principle is to utilize a plurality of identical sections 10–50, representing any number of sections from 1 to $n$ to drive a resonant load 60 which may be an electrical tank circuit resonant at a predetermined output frequency. Each section is to employ switching devices, not shown, in a binary switching mode and the sections are controlled by the driver 16 which provides properly coordinated and timed control signals $D_1$–$D_n$. When any section, for example section 10, receives a signal $D_1$ from the driver 16, the section is allowed to store electrical energy from the power supply 12 by an electrical charging operation. Then another signal $D_1'$ is received from the driver 16 whereupon the section delivers the stored energy to the resonant load 60 by discharging, and energy is fed to the resonant load through the circuit means 11. The driver means 16 provides signals $D_1$–$D_n$, which control the operation of the identical sections 10–50 such that the charging and discharging of each section is properly interlaced with the other sections such that discharging of energy into the resonant load 60 occurs in pulses at predetermined time intervals. For example, the individual sections may be driven to feed pulses of energy into the resonant load 60 in "Gatling gun" fashion at a rate equal to the resonant frequency of the load or some harmonic thereof, resulting in a build up of oscillatory circulating currents in the load at its resonant frequency. The resonant load 60 then accumulates the energy from each of the sections to produce a very high power ouput signal through the use of relatively lower power handling sections employing correspondingly lower power devices. In effect, the invention then provides a means for generating a relatively high powered output signal which lends itself readily to the application of providing for an RF power source for a radio frequency transmitter. As will be explained subsequently, the subject invention is particularly useful in providing for an RF source in the very low frequency range of radio transmitters in which it is desirable to employ semiconductor devices such as PNPN semiconductor switches, hereinafter referred to as controlled rectifiers rather than vacuum tubes.

Figure 2:
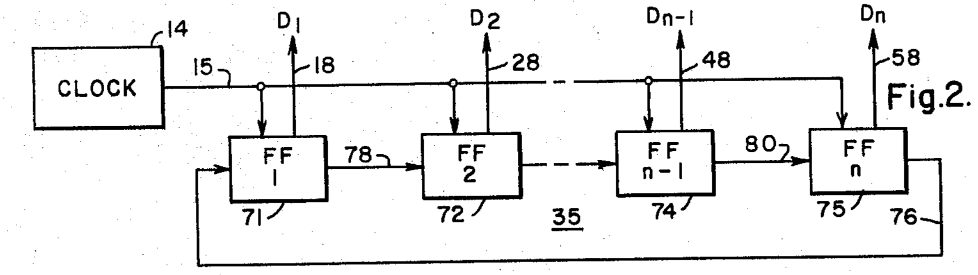
FIGURE 2 is a block diagram illustrating one type of driver means for the subject invention.
Figure 3:
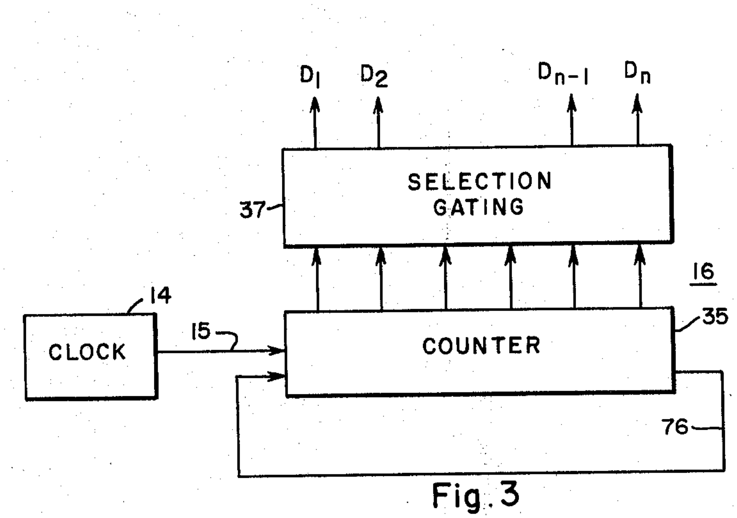
FIGURE 3 is a block diagram of another type of driver means by which the subject invention may be driven.

The controlling of the sections can be accomplished by the means shown in block diagrammatic form in FIGS. 2 and 3. FIG. 2 illustrates one means for generating the control signals for the plurality of sections shown in FIG. 1 and comprises a ring counter 35 which is well known to those skilled in the art. Briefly, the ring counter 35 includes a plurality of flip-flops (1 to *n*) depending upon the number of sections utilized in FIG. 1. Shown is four stages of flip-flops corresponding to stage 1, stage 2, stage $n-1$ and stage $n$ and are designated 71, 72, 74 and 75. Flip-flops 71 through 75 are connected by means of suitable well known circuit means 78, 79 and 80 such that counting signals are transferred from one stage to the next and additionally a feedback loop 76 is included from flip-flop 75 back to the first flip-flop 71 to provide for continuous counting. A signal from the master clock or synchronizer of FIG. 1 is fed to each of the stages by means of a circuit line 15 to maintain a proper synchronization. As such, the ring counter 35 provides control signals $D_1$ on circuit 18, $D_2$ on circuit 28, $d_{n-1}$ on circuit 48 and $D_n$ on circuit 58. These control signals $D_1$ through $D_n$ are time related in the well known manner such that they are capable of operating to trigger the plurality of sections 10–50 of FIG. 1 in a sequential manner.

FIG. 3 illustrates another manner in which the control signals $D_1$–$D_n$ may be generated and in this embodiment in addition to the counter 35 including the feedback loop 76, there is included a selection gating circuit 37 adapted to receive the output signals of the counter to provide a more flexible triggering procedure or sequence. The selection gating circuit 37 provides signals $D_1$ through $D_n$ on lines 18–58 and are connected to the sections 10–50 of FIG. 1 as previously described. The selection gating circuit 37 facilitates the predetermined pattern in which the energy from the various units are delivered to the resonant load 60. This, for example, can provide a means for modulating the output signal from the load 60.

Figure 4:
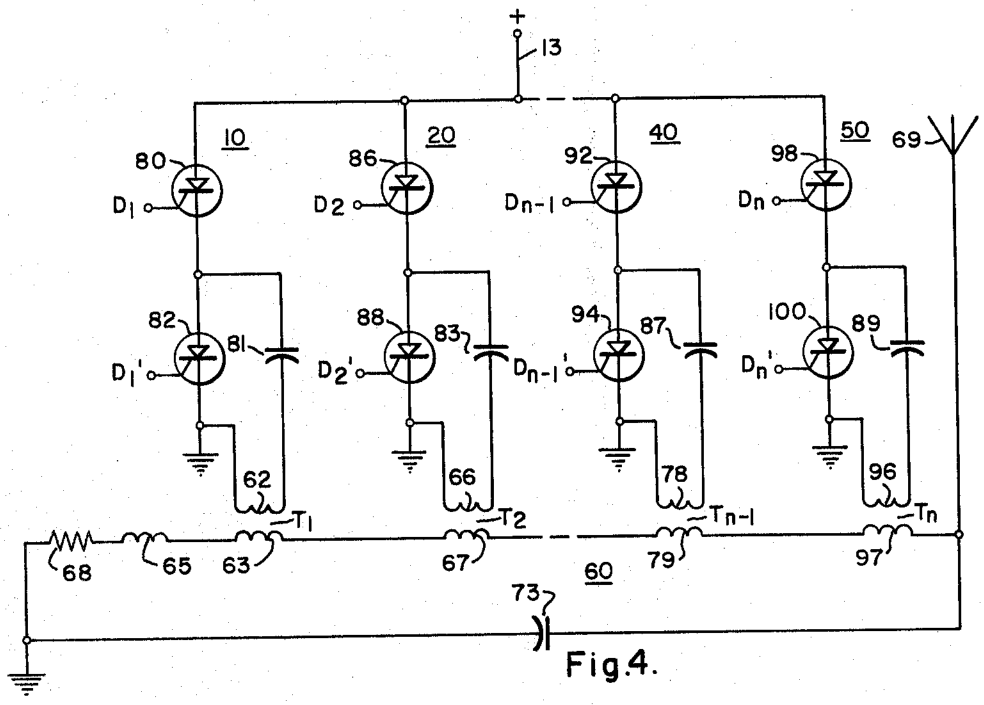
FIGURE 4 is a schematic diagram illustrative of a plurality of energy storage units which can be used with the subject invention.

Attention is now directed to FIG. 4 which is an illustrative example of a circuit which can be utilized as the plurality of identical units or sections 10–50 of FIG. 1. In all cases, the circuitry illustrated comprises energy storage elements in combination with electrically controllable switches, shown for purposes of illustration as controlled rectifiers, to predeterminedly charge and discharge each of the sections 10–50 according to the control provided by the trigger signals received from the driver 16 of FIG. 1. It should be pointed out, however, that the controlled rectifiers are shown by way of example only and are not to be considered in a limiting sense for it is thought that those skilled in the art would readily adapt other known switching devices according to the needs of anyone wishing to practice the invention.

The example, illustrated in FIG. 4 comprises a plurality of sections 10, 20, 40 and 50 corresponding to 1, 2, *n*-1 and *n*, respectively. Each section is comprised of two controlled rectifiers in circuit combination with a series resonant circuit combination including an inductance and a capacitor. More particularly, taking one section, for example, section 10, controlled rectifiers 80 and 82 are connected in series between a source of D.C. potential, not shown, and a point of reference potential referred to hereinafter as ground. The controlled rectifiers 80 and 82 are connected such that a positive D.C. potential is applied to the anode electrode of the controlled rectifier 80 while its cathode is connected to the anode electrode of controlled rectifier 82. The cathode electrode of controlled rectifier 82 is connected to ground. A series resonant circuit comprising capacitor 81 and inductance 62, which is the primary winding of transformer T1, is connected in series to ground and the common connection between the cathode electrode of controlled rectifier 80 and the anode electrode of controlled rectifier 82.

A controlled rectifier is "turned on" by applying a trigger pulse to its gate. It remains "on," however, when the trigger pulse is removed as long as there is sufficient forward current flow through it.

The operation of the section 10 of FIG. 4 is such that when a trigger pulse $D_1$ is applied to the gate electrode of controlled rectifier 80, from a driver such as is illustrated in FIGS. 1–3, the device becomes conducting allowing current to flow from the supply source, not shown, through the line 13 through the controlled rectifier and then through the storage capacitor 81 and inductance 62 to ground. The current that flows changes capacitor 81 resonantly to a voltage greater than the source voltage because of the presence of inductance 62. Thereupon capacitor 81 attempts to discharge back through controlled rectifier 80 into the source 13. However, attempting to force current through the controlled rectifier in the reverse direction causes it to turn off stopping all current flow. Thereafter, after sufficient time has been allowed for the recently recovered controlled rectifiers to recover completely, a trigger pulse $D_1'$ from the driver, noted above, is provided to the gate electrode of silicon controlled rectifier 82 whereupon it conducts and capacitor 81 discharges through the series resonant circuit comprising capacitor 81 and inductance 62. The energy transferred to the series resonant circuit is coupled to the secondary winding 63 of transformer T1 which is a portion of the resonant load 60. The load 60 is illustrated as the output circuit of radio transmitter and comprises a plurality of inductance sections 63, 67, 79 and 97 which are secondaries of respective transformers T1, T2, T*n*–1 and T*n*, a loading coil 65, a capacitance 73, a resistance 68 and an antenna 69. The loading coil 65 is included for properly tuning the antenna to the desired signal frequency to be radiated. The capacitance 73 is the distributed capacitance of the output circuit while the resistance 68 is the inherent resistance characteristic of the inductances of the load 60.

By selectively activating sections 10, 20, 40 and 50 in a predetermined manner, a large amount of energy can be transferred to the load 60 utilizing relatively low powered devices to provide a high powered output since each section delivers only a portion of the total energy to the load. Since the load circuit 60 is resonant, sinusoidal current flows in the load circuit.

The fact that controlled rectifiers have an inherent slow forward recovery time makes the present invention particularly adaptable for their use. By selectively controlling the charging and discharging of the capacitor in each section, e.g. sequential operation, allowance is made for device recovery without interrupting the continuous outflow of power to the load. A given section operates and then stands idle allowing its controlled rectifiers to recover their forward characteristics before they are again exposed to forward voltage stresses. During this time, operation is picked up by the other sections in order.

What has been shown and described, therefore, is a means of generating a relatively large alternating current power capable of providing RF power for apparatus such as a radio transmitter. It is thus possible to generate a large amount of alternating current power through the use of a plurality of identical relatively smaller power handling units combining to deliver incremental amounts of power to a resonant load such as the antenna circuit of a transmitter, which, in turn, provides an output signal of relatively large amplitude depending upon the number of sections employed.

Although the present invention has been described with a certain degree of particularity, it should be understood that the present disclosure has been made by way of example only and that numerous changes in the detail of the circuitry in the combination or arrangement of elements may be resorted to without departing from the scope and spirit of the present invention.

For example, the present invention may be implemented by the use of circuitry described and claimed in co-pending application U.S. Serial No. 291,581, filed June 28, 1963 by Wayne R. Olson et al. wherein is taught an improved type of energy storage units for the transfer of energy to a resonant load. Another type of circuitry for the storage and transfer of energy to a resonant load is shown and claimed in co-pending application U.S. Serial No. 291,559, filed June 28, 1963 by Wayne R. Olson et al. Both aforementioned co-pending applications are assigned to the assignee of the present invention. Additionally, a shift register might be utilized with the driving source to furnish a particular drive signal or a set of cascaded delay elements such as a delay line may be resorted to to provide the control signals. Also the driver may be excited by an oscillator such as a monostable multivibrator or possibly a free running multivibrator. Modulation of the output signal generated in the resonant tank circuit may be amplitude modulated, for example, by the manner in which the driving signals are sequenced or alternatively varying the amplitude of the supplying power supply voltage. Phasing of the drive signals may be resorted to so as to partially or completely cancel the effective amplitude of the tank voltage. Phase modulation may be accomplished by varying the phase of the input signal to the driver and frequency modulation may be accomplished by varying the frequency of the oscillator.

What we claim is:

1. A high power sine wave generator comprising, in combination: a direct current potential source; a plurality of energy storage sections each including a series resonant circuit, first controllable electrical switch means when conductive connecting said resonant circuit to said potential source to be charged, and second controllable electrical switch means when conductive connecting said resonant circuit to ground; means for triggering each said switch means to its conductive state in a predetermined sequence; and a resonant load commonly connected to each said series resonant circuit to receive power therefrom in said preselected sequence as each switch means is rendered conductive.

2. An RF power source for a solid state radio frequency transmitter comprising, in combination: a direct current potential source; a plurality of energy storage sections each including first controllable electrical switch means and second controllable electrical switch means connected in series circuit combination between said potential source and electrical ground; transformer means including a primary winding and a secondary winding for each section; a series resonant circuit for each section and including a capacitor and its respective primary winding connected to be charged by said potential source when said first switch means is conductive and to be discharged when said second switch means is conductive; means for triggering each said switch means in each said energy storage section to its conductive state in a predetermined sequence; and a common resonant load circuit including a tank capacitor and the secondary winding of each transformer means for receiving power from each series resonant circuit as each switch means is rendered conductive in said predetermined sequence.

3. A sine wave generator for very low frequencies comprising in combination: a direct current potential source; a plurality of semiconductor switch means connected in a plurality of series circuit combinations, each combination connected at one end to said potential source and at the opposite end to a point of reference potential; transformer means including a primary winding and a secondary winding for each said combination; an energy storage capacitor for each said combination; circuit means for connecting the energy storage capacitor and said primary winding of each combination in a series resonant circuit to be charged by said potential source when said first switch means is conductive and to be discharged when said second switch means is conductive; means for triggering each said switch mean to its conductive state in a predetermined sequence; and a common resonant load circuit including a tank capacitor and each secondary winding of each transformer means connected to receive energy from each series resonant circuit in the same predetermined sequence as each switch means is triggered.

References Cited by the Examiner

UNITED STATES PATENTS

| | | | |
|---|---|---|---|
| 2,721,265 | 10/1955 | Rothman et al. ______ | 331—166 |
| 3,147,419 | 9/1964 | Cope ____________ | 307—88.5 |

ROY LAKE, *Primary Examiner.*

S. H. GRIMM, *Assistant Examiner.*